US006320781B1

(12) United States Patent
Li et al.

(10) Patent No.: US 6,320,781 B1
(45) Date of Patent: Nov. 20, 2001

(54) APPARATUS FOR MINIMIZATION OF DATA LINE COUPLING IN A SEMICONDUCTOR MEMORY DEVICE

(75) Inventors: Wen Li; Manny K. Ma, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/824,363

(22) Filed: Apr. 2, 2001

Related U.S. Application Data

(63) Continuation of application No. 09/610,760, filed on Jul. 6, 2000, now Pat. No. 6,259,621.

(51) Int. Cl.[7] ....................................................... G11C 5/06
(52) U.S. Cl. .............................. 365/69; 365/63; 365/206
(58) Field of Search ................................ 365/69, 63, 206

(56) References Cited

U.S. PATENT DOCUMENTS

| | | | | |
|---|---|---|---|---|
| 4,914,502 | * | 4/1990 | Lebowitz et al. | 365/63 |
| 5,060,189 | * | 10/1991 | Ota | 365/63 |
| 5,534,732 | * | 7/1996 | DeBrosse et al. | 365/63 |
| 6,011,710 | * | 1/2000 | Wiggers | 365/63 |
| 6,034,879 | * | 3/2000 | Min et al. | 365/63 |
| 6,108,230 | * | 8/2000 | Anh et al. | 365/63 |
| 6,140,704 | * | 10/2000 | Kang et al. | 365/69 |
| 6,188,598 | * | 2/2001 | Mueller et al. | 365/69 |

OTHER PUBLICATIONS

Micron part No. MT48LC16M4 (64Mbit SDRAM, 16 × 4 configuration) (no copy included: on sale and in public use one year before the priority date of this application. Please see Information Disclosure Statement for Details).

Betty Prince, "Semiconductor Memories: A Handbook of Design, Manufacture and Application," pp. 285–288, 293–297 (2d ed. 1991, John Wiley & Sons, Ltd.).

* cited by examiner

*Primary Examiner*—Tan T. Nguyen
(74) *Attorney, Agent, or Firm*—Howrey Simon Arnold & White

(57) ABSTRACT

The present disclosure includes a twist architecture useful for the data lines in a memory device. The architecture involves the twisting of four data lines to create four portions such that each data line occupies a different position in each of the four portions. Specifically, in the first portion, the first data line is adjacent to the second data line, the second data line is adjacent to the third data line, and the third data line is adjacent to the fourth data line; in the second portion, the third data line is adjacent to the first data line, the first data line is adjacent to the fourth data line, and the fourth data line is adjacent to the second data line; in the third portion, the fourth data line is adjacent to the third data line, the third data line is adjacent to the second data line, and the second data line is adjacent to the first data line; and in the fourth portion, the second data line is adjacent to the fourth data line, the fourth data line is adjacent to the first data line, and the first data line is adjacent to the third data line. Such an architecture reduces unwanted parasitic capacitive coupling between the data lines and hence improves speed.

15 Claims, 7 Drawing Sheets

APPARATUS FOR MINIMIZATION OF DATA LINE COUPLING IN A SEMICONDUCTOR MEMORY DEVICE

This application is a continuation of application Ser. No. 09/610,760, filed Jul. 6, 2000 now U.S. Pat. No. 6,259,621, which is incorporated by reference.

FIELD OF THE INVENTION

This invention relates generally to the field of semiconductor devices and specifically to a method and apparatus for minimization of data line coupling in a semiconductor memory device.

BACKGROUND OF THE INVENTION

As Dynamic Random Access Memories (DRAM) grow larger and are built with smaller geometries, undesirable parasitic capacitances between lengthy conductors are becoming more prevalent. A simple diagram of a portion of a DRAM integrated circuit is shown in FIGS. 1A and 1B. The disclosed DRAM includes several subarrays 16, each of which contains a portion of the memory array. Thus, for example, a 16 M-bit memory array might be broken up into 64 256 K-bit subarrays. As one of skill in the art of DRAM architecture will understand, the columns 14, or digit lines, in the subarrays 16 in FIGS. 1A and 1B run from up and down and the rows in the subarrays run left to right (not shown).

The digit lines 14 connect to sense amps 13 which reside between the subarrays 16, and the rows connect to row decodes 15 which also reside between the subarrays 16. As is commonplace in the industry, the digit lines 14 are arranged such that a particular sense amp 13 receives a complementary (opposite) pair of logic signals, represented in FIG. 1B as DIGIT and DIGIT*. For example, when DIGIT=logic '1' (typically 5 Volts or less), DIGIT*=logic '0' (typically 0 Volts), and vice versa. After sensing, and when a given digit line pair 14 is selected by the application of signal CS, the logic of digit lines DIGIT and DIGIT* are transferred to the I/O lines 17 that run through the sense amps 13. Like the digit lines 14, the I/O lines 17 are also complementary, as represented by I/O and I/O*. If these I/O lines 17 appear within a selected section, as denoted by the application of signal "SECTION," they are transferred, again in complementary form, to the data lines 18 which run along side the row decodes 15. ("Data lines" should be interpreted for purposes of this disclose as distinct from the "digit lines" that appear within the subarrays). Ultimately, the data line pairs 18 are input into a data line amplifier 19, which in turn sends a selected data line 18 (selection not shown) to the data path 20 which interfaces with the rest of the DRAM's peripheral circuitry. In a preferred embodiment, the data line pairs 18 constitute conductors that run along side the row decode 15 before making contact with the data line amplifier 19. These data line pairs 18 together constitute a data line bus 21.

It is known in the prior art that as the length of conductors increases and as the spacing between them decreases that the capacitive coupling between conductors increases, thus negatively affecting the speed at which signals can be conducted. Heretofore, this problem has been particularly acute with respect to the digit lines 14 in the array, which are typically very long, very thin, and spaced at minimum distances with respect to one another. Accordingly, the prior art has employed methods of "twisting" the digit lines 14 to try and reduce the effects of parasitic capacitance between digit lines.

As shown in FIG. 2A, which can be described as a non-twisted architecture for the digit lines 14, a "worst case" and "best case" scenario with respect to the parasitic capacitance 26 can be obtained. In the worst case, the effect of parasitic capacitance 26 is maximized. For example, suppose a '1' logic state appears on digit line Digit0. In this case, Digit0* will necessarily be held at a complementary '0' logic state. If Digit1* is also held at logic '0,' then Digit0 will be surrounded for its entire length by digit lines of the opposite data states. Because Digit0 is completely surrounded on both sides by the opposite logic state, the ability to transport a logic '1' is negatively affected to the greatest extent possible. The coupling coefficient of Digit0 for this worse case scenario can be defined as C=1.

In the best case, the effect of parasitic capacitance 26 is minimized. For example, suppose a '1' logic state appears on digit line Digit3*, and that adjacent digit line Digit2 is also held at '1.' Although the complementary digit line Digit3 is necessarily at the opposite logic state, the fact that there is no voltage difference between Digit3* and Digit2 works to effectively eradicate the parasitic capacitance 26 between these two digit lines. Hence, Digit3* can be accessed faster than Digit0 (i.e., the worst case) due to the reduction in parasitic capacitance. Because Digit3* is surrounded on only one side by the opposite logic state, the coupling coefficient of this best case scenario can be defined as C=0.5.

It is known in the prior art that the digit line pairs 14 can be twisted to reduce the effect of intra digit line pair capacitance, i.e., between a given digit line and its complement. A prior art architecture that achieves this result is shown in FIG. 2B. This twisting architecture is interesting in that it has no best or worse case. Regardless of the status of the digit lines, a coupling coefficient of C=0.75 will always result. If we take digit line Digit1='1' as an example, we see that Digit1 is always bordered by Digit1*='0' on one side. Because this potential difference occurs for the entire length of Digit1, Digit1* contributes C=0.5 to the coupling coefficient of Digit1. On the side of Digit1 that is not adjacent to Digit1*, we see that Digit1 meets with Digit2='1' for one-fourth of its length (which contributes nothing to the coupling coefficient because there is no potential difference between Digit1 and Digit2), and meets with Digit2*='0' for one-fourth of its length. Thus, Digit2* contributes another C=0.125 to the coupling coefficient of Digit1 for a total of C=0.625. Likewise, Digit1 meets with Digit0* for one-fourth of its length, which contributes another C=0.125 to the coupling coefficient of Digit1 for a total of C=0.75. If the logic states of Digit2 and Digit2* or Digit0 and Digit0* are changed to '0' and '1' respectively, the nature of the coupling with respect to Digit1 does not change, because Digit1 will still "see" a logic state of '0' on one full side and half of its other side. Hence, using the twisting architecture of FIG. 2B, the coupling coefficient of any digit line is C=0.75. This provides a benefit over the non-twisted architecture of FIG. 2A in that the amount of coupling, and hence the rate at which the digit lines can be accessed, are constant. However, the twisting architecture of FIG. 2B, while providing constant coupling, also tends to slow access to the digit lines down. In effect, the architecture of FIG. 2B averages the coupling, and indirectly the speed, of the digit lines when compared with the non-twisted architecture of FIG. 2A.

Another digit line twisting architecture that is known in the art is shown in FIG. 2C. This architecture has been used on DRAM products manufactured by Micron Technology, Inc., including part number MT48LC16M4 (16M×4 synchronous DRAM). As used on these Micron DRAMs, a single twist 24 appears at the center of the subarray 16 that the digit lines 14 are contained in. This architecture has the benefit of reducing that portion of the coupling coefficient that is provided by a given digit line's complement. The architectures of FIGS. 2A and 2B show that any given digit line is always bordered on one full side by its complement. The architecture of FIG. 2C reduces this intra digit line capacitance by physically separating a given digit line and its complement for at least a portion of the digit line's progression through the subarray.

In contrast to the digit lines, a problem that is arising in modern day DRAMs is that the data lines 18 are becoming longer. As can be seen in FIG. 1A, the data bus 21 runs along several subarrays, and is much longer than any of the digit lines 14 appearing within a given subarray 16. Moreover, as designers are forced to pack more structures into limited layout space, the data bus is being built with data lines that are narrower and packed ever closer together. Accordingly, the problems of parasitic capacitance have become a bigger issue with respect to the data bus. Yet, the inventors are not aware of the use of any architectural strategies to reduce parasitic capacitances in a DRAM data line bus. The present invention provides an architecture that achieves this goal, and hence improves the coupling coefficient and speed on DRAM devices.

SUMMARY OF THE INVENTION

In view of the foregoing considerations, an embodiment of the present invention includes a twist architecture useful for the data lines in a memory device. The architecture involves the twisting of four data lines to create four portions such that each data line occupies a different position in each of the four portions. Specifically, in the first portion, the first data line is adjacent to the second data line, the second data line is adjacent to the third data line, and the third data line is adjacent to the fourth data line; in the second portion, the third data line is adjacent to the first data line, the first data line is adjacent to the fourth data line, and the fourth data line is adjacent to the second data line; in the third portion, the fourth data line is adjacent to the third data line, the third data line is adjacent to the second data line, and the second data line is adjacent to the first data line; and in the fourth portion, the second data line is adjacent to the fourth data line, the fourth data line is adjacent to the first data line, and the first data line is adjacent to the third data line. Such an architecture reduces unwanted parasitic capacitive coupling between the data lines and hence improves speed.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein.

DETAILED DESCRIPTION OF A SPECIFIC EMBODIMENT OF THE INVENTION

In the disclosure that follows, in the interest of clarity, not all features of actual implementations are described. It will of course be appreciated that in the development of any such actual implementation, as in any such project, numerous engineering and design decisions must be made to achieve the developers' specific goals and subgoals (e.g., compliance with system- and business-related constraints), which will vary from one implementation to another. Moreover, attention will necessarily be paid to proper engineering and design practices for the environment in question. It will be appreciated that such a development effort might be complex and time-consuming, but would nevertheless be a routine undertaking for those of ordinary skill in the field of semiconductor design.

Figure 1A:
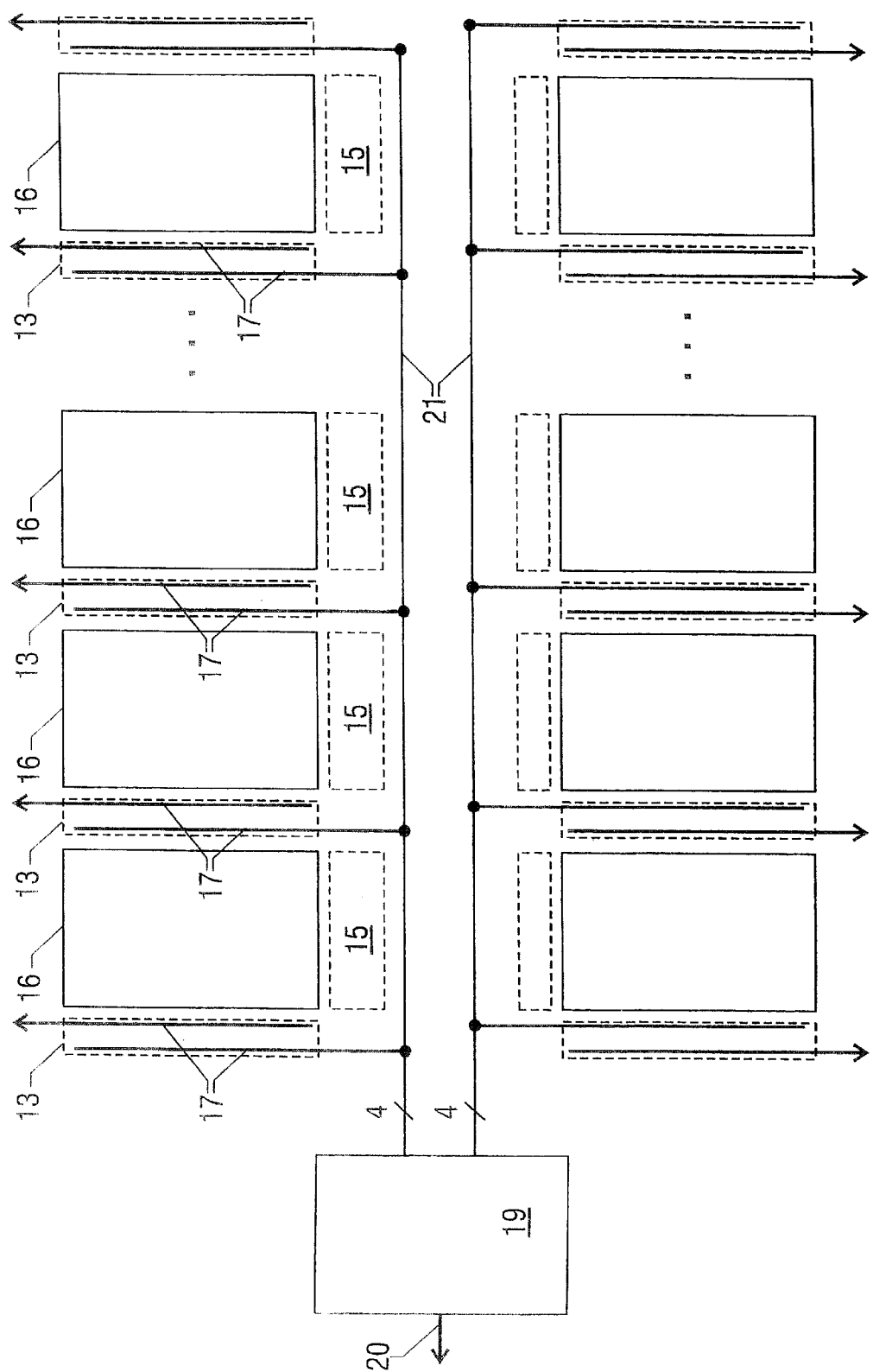
FIG. 1A shows a portion of a DRAM integrated circuit.
Figure 1B:
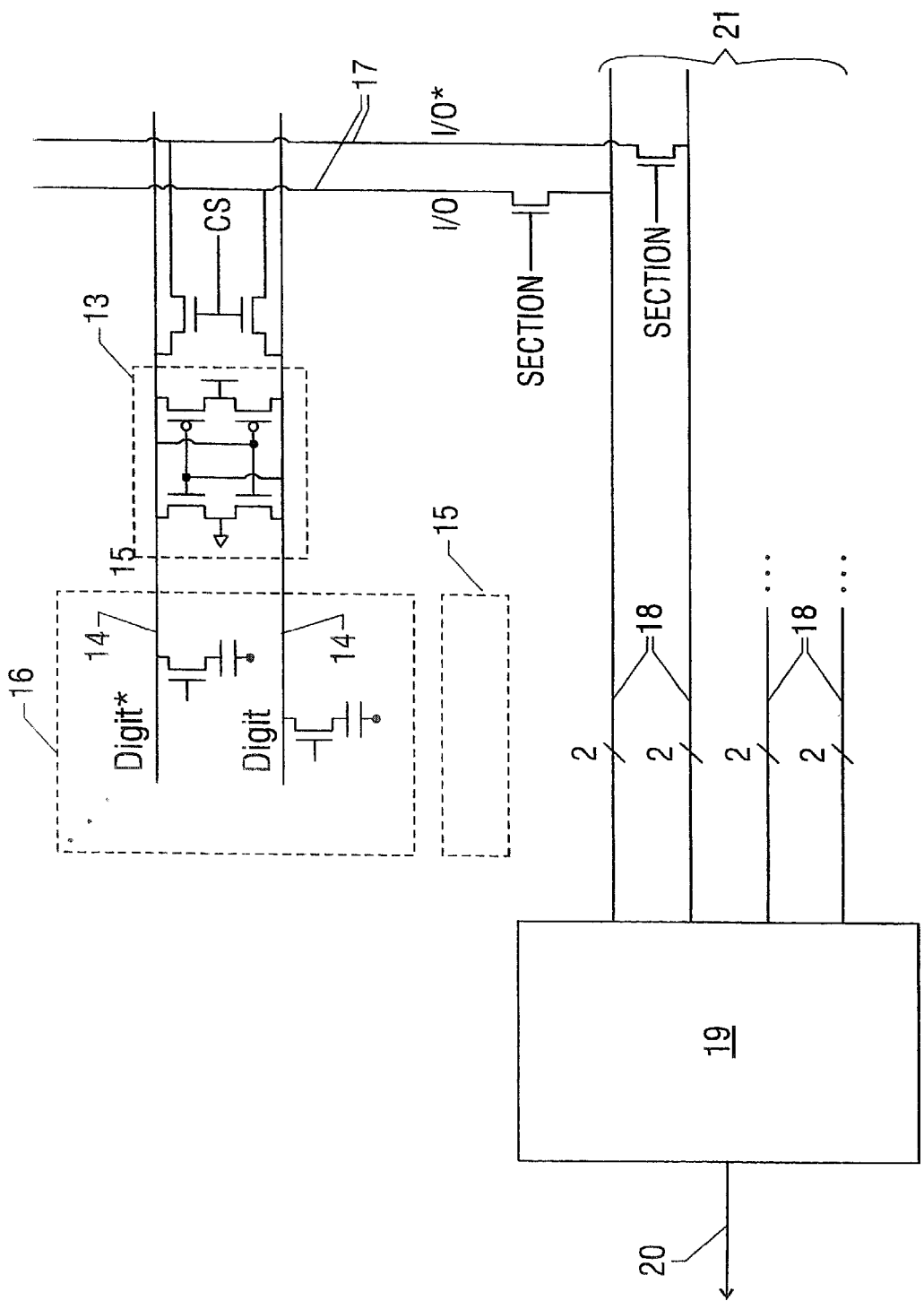
FIG. 1B shows an expanded view of a portion of FIG. 1A.
Figure 2A:
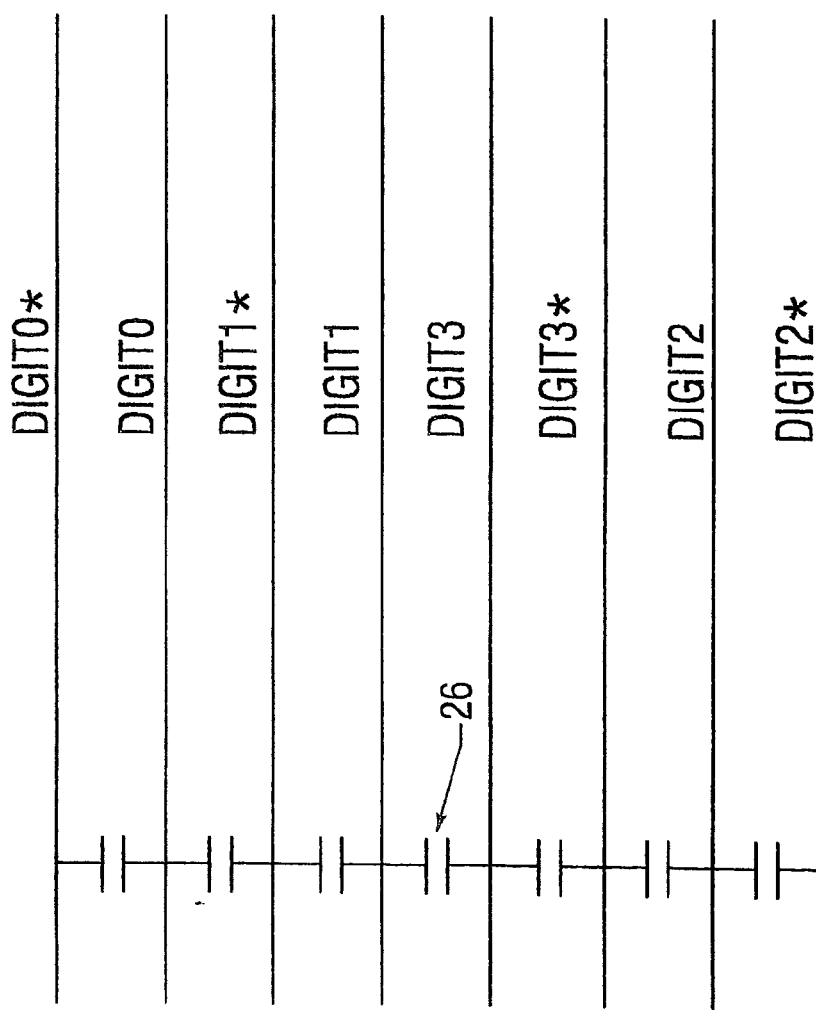
FIG. 2A shows a non-twisted digit line architecture of the prior art.
Figure 2B:
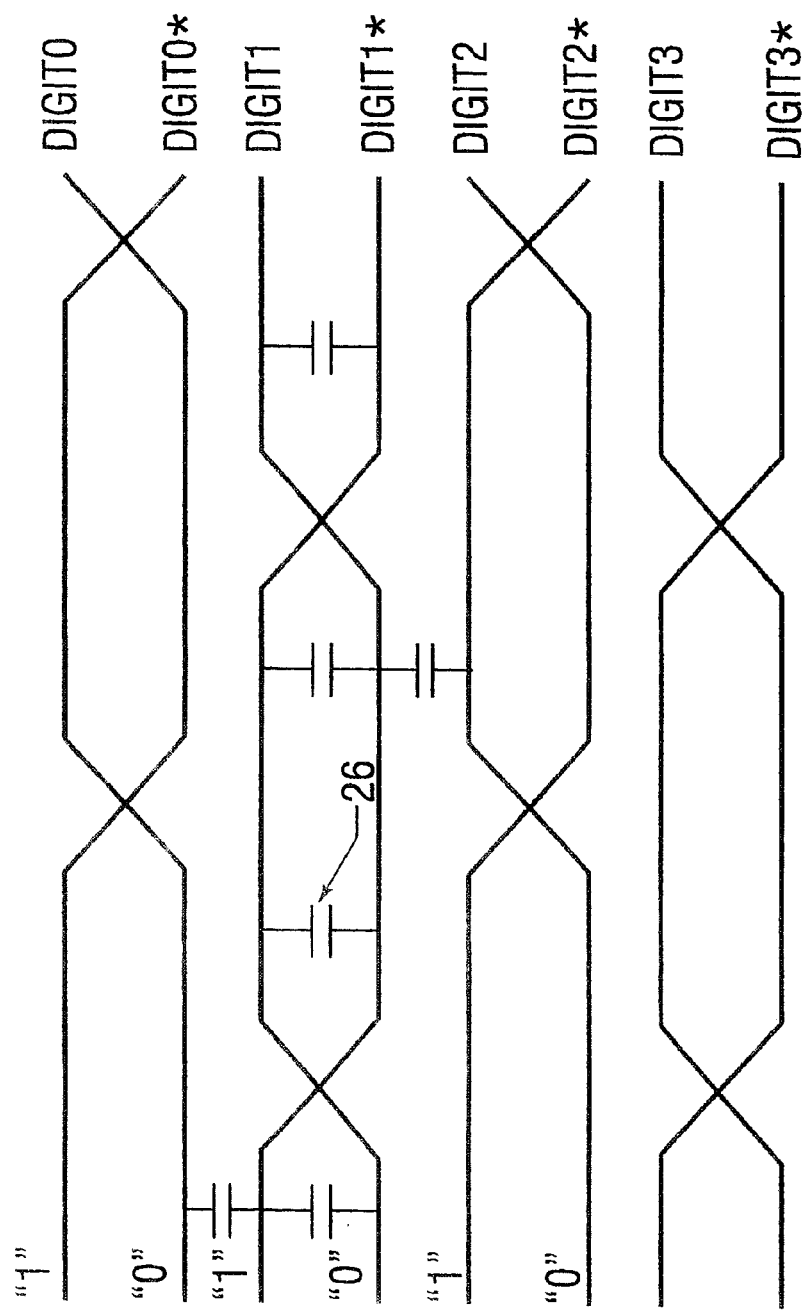
FIG. 2B shows a twisted digit line architecture of the prior art.
Figure 2C:
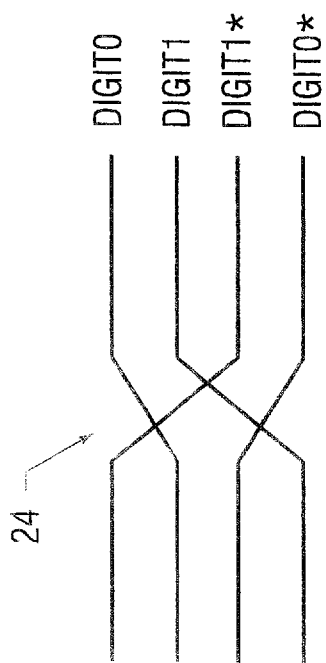
FIG. 2C shows a twisted digit line architecture of the prior art.
Figure 3:
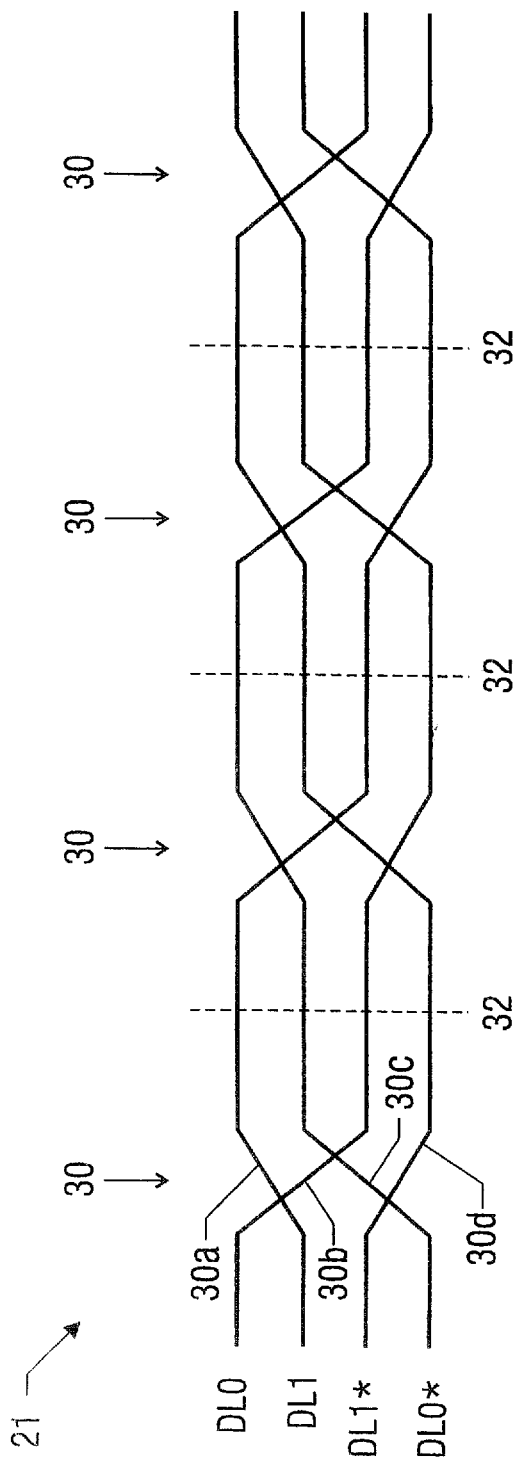
FIG. 3 shows an embodiment of the twisted data line architecture built in accordance ii with the invention.

FIG. 3 shows an embodiment of the data line twist architecture of the present invention. The disclosed data line twist architecture uses the basic digit line twist architecture shown in FIG. 2C but modifies it by twisting the lines four times. When twisted four times (or a multiple of four times) the data line signals once again appear at their starting positions, as shown in FIG. 3. Referring to FIG. 3, the four twists 30 are preferably found at locations 1/8, 3/8, 5/8, and 7/8 along some integral portion of the length of the data line bus 21. Also, the location between the twists 30, marked as 32 in FIG. 3, could be made to incorporate structures which boost the logic signal of the data lines, such as sense amps, although this is not presently preferred.

Figure 4:
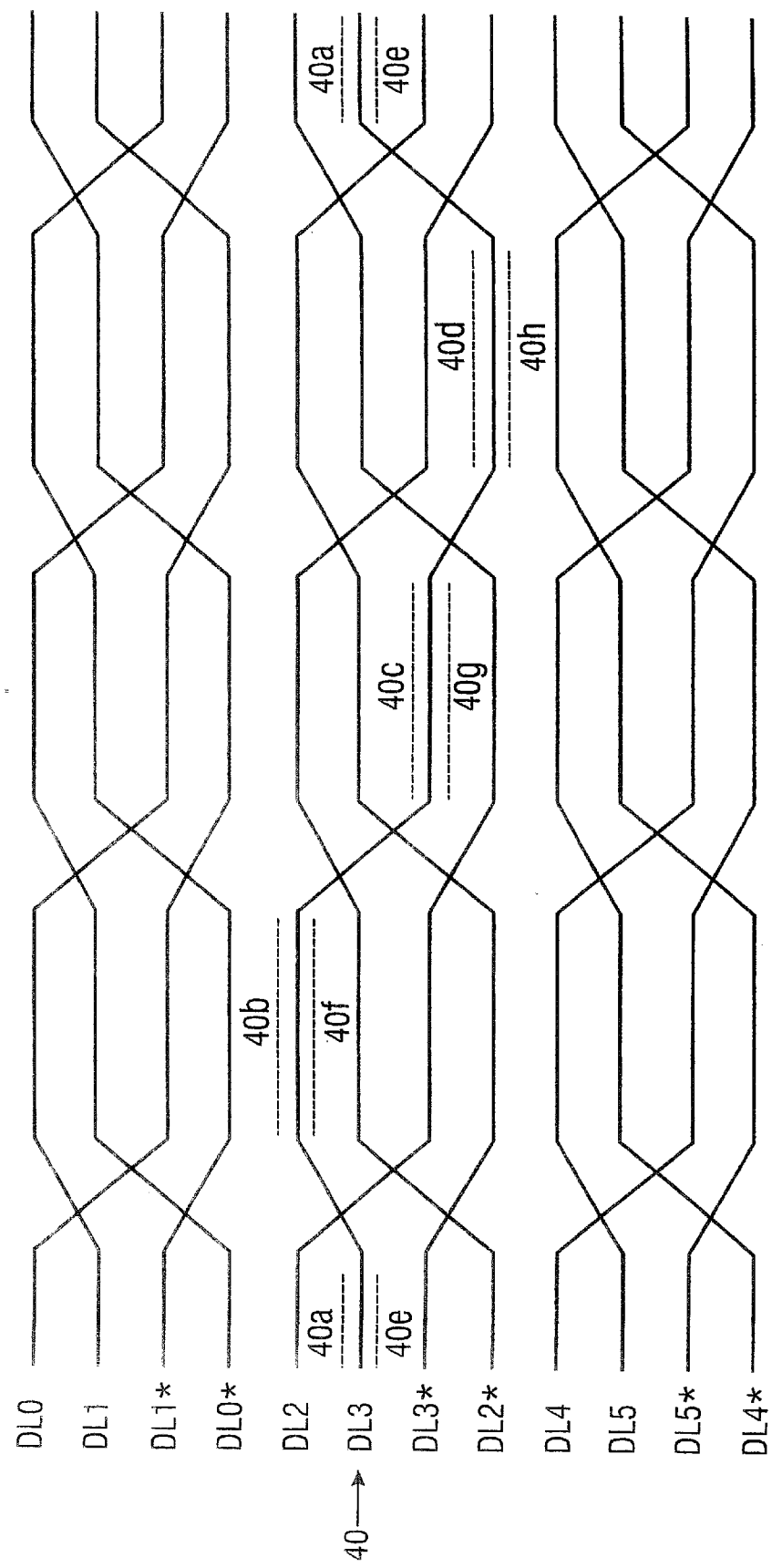
FIG. 4 shows the architecture of FIG. 3 in a more expansive setting.

FIG. 4 shows that the coupling coefficient for any given data line will be either C=0.75, 0.625, or 0.5, (i.e., 6/8, 5/8, or 4/8). To understand this result, it should be understood that a given data line 40 (DL3 in FIG. 4) should be viewed as having eight edge pieces 40a, 40b, 40c, 40d, 40e, 40f, 40g, and 40h. (Edge pieces 40a and 40e are actually comprised of 2 one-sixteenth sized pieces). When any one of these edges is adjacent to a data line of a different logic state, a figure of C=0.125 (1/8) is added to the coupling coefficient for that data line. If we take DL3 as an example, we see that edges 40e and 40c will always be adjacent to DL3*, and hence will add C=0.125+0.125 or C=0.25 to coupling coefficient of DL3. Furthermore, depending on the logic state of the other data line pair within a four column group, i.e., DL2 and DL2*, either edge 40a or edge 40f (but not both) will contribute another C=0.125 to the coupling coefficient of DL3 (i.e., C=0.375). Likewise, either edge 40g or edge 40d (but not both) will contribute another C=0.125 to the coupling coefficient of DL3 (i.e., C=0.5). This leaves only edges 40h and 40b unaccounted for. Whether edges 40h and 40b will contribute to the coupling coefficient of column DL3 will depend on the data states of DL5* and DL1* respectively. If the data state of only one of these data lines is complementary to DL3, then the DL3 coupling coefficient will be brought up to C=0.5+0.125=0.625. If the data state of both DL5* and DL1* is complementary to DL3, the DL3 coupling coefficient will be brought up to C=0.625+0.125= 0.75. Thus, the coupling of any given data line will be either C=0.5, 0.625, or 0.75.

Figure 5:
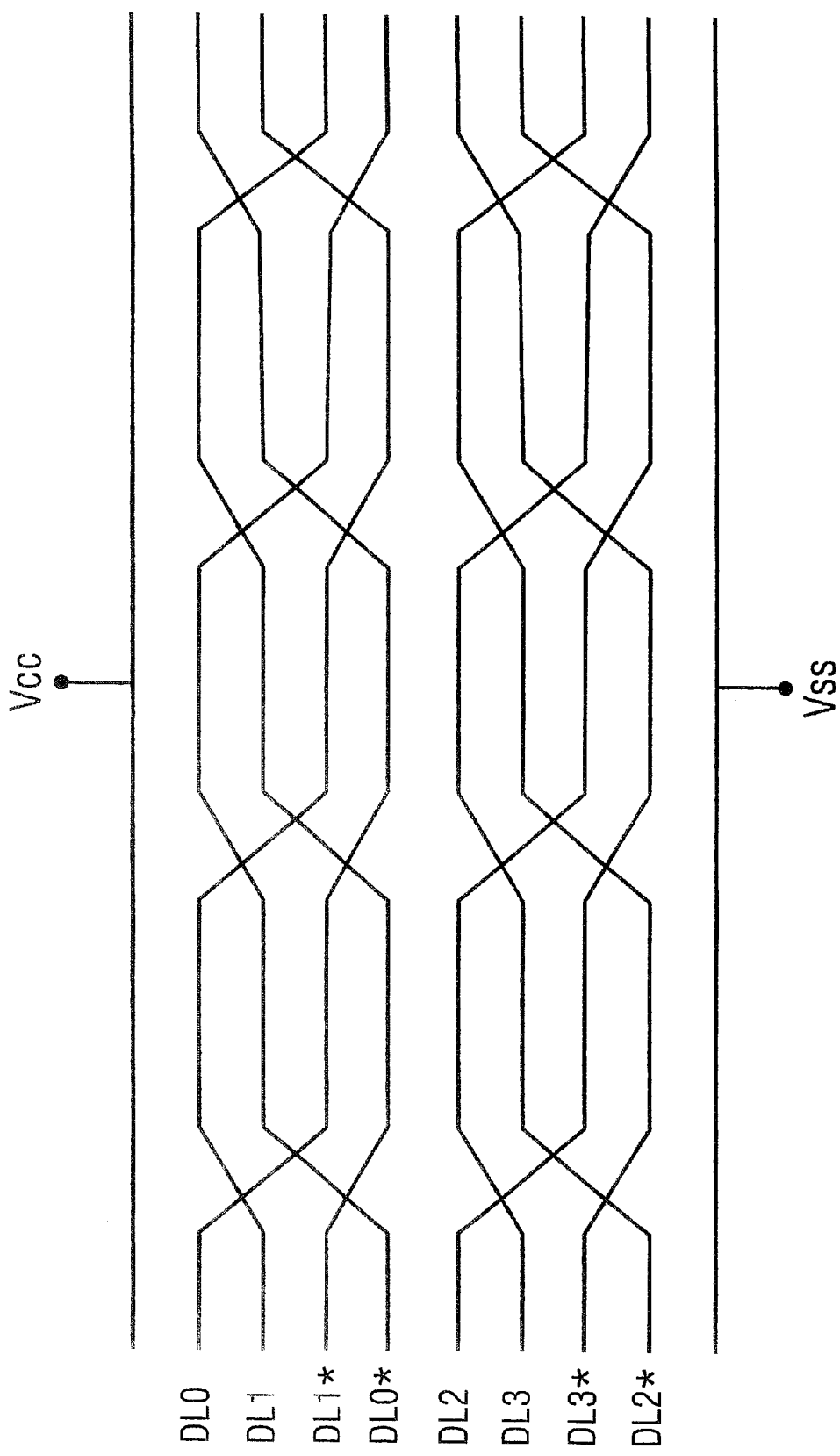
FIG. 5 shows a preferred embodiment of the architecture of FIG. 3 which includes power busses.

A preferred embodiment of the invention is shown in FIG. 5. In this embodiment, two groups of four twisted data lines are grouped together, and are bounded by a power supply bus (i.e., Vcc) and a ground bus (i.e. Vss), both of which may be referred to generally as a "power bus." Computer simulations have shown that the use of the twist architecture of FIG. 5 improves and unifies the potential difference that is presented to the data line amplifier 19 between a given data line and its complement. When compared with the non-twisted bit line architecture of FIG. 2A, a potential difference of ranging from 350 mV (worst case) to 700 mV (best case) is found between the data lines in a given data line pair 18. By contrast, the simulation shows a potential difference of approximately 740 mV for all four data line pairs when the twist architecture of FIG. 5 is used. (A power supply voltage of 2.5V was used for the simulation, and the data lines were twisted sixteen times). Both the increase in this potential difference and its uniformity constitute significant improvements in sensing and hence speed of the device: a larger potential difference allows the data line amplifier to more quickly make an accurate determination of the logic state of both a given data line and its complement; the uniformity in the potential between data lines in a given data line pairs means the data line amplifiers do not have to be designed for the worst case (i.e., to accurately sense the smallest potential difference), thus increasing sensing margin.

One skilled in the art will recognize that there are many ways to affect the twists at location 30. It is presently contemplated by the inventors that the data lines 18 in the data line bus 21 will be built in a second level of "metal" (commonly known in the industry as "metal 2"). "Metal" is commonly associated in the industry with some form of aluminum alloy, but any conductive material will suffice. Due to the nature of the twist 30 in FIG. 3, the entire data lines 18 cannot be completely built in metal 2 without shorting together. Instead, it is necessary to build portions of the twists 30 in metal 1, which is the conductive layer beneath the metal 2 layer (but generally above the polysilicon layers that are used to fabricate the transistors). More specifically, portions 30a and 30c of twist 30 are built in metal 1 and connected to the straight portions of the data lines 18 through vias in the dielectric layer between metal 1 and metal 2. This allows portions 30b and 30d to be built in metal 2. Alternatively, portions 30b and 30d of twist 30 can be built in metal 1, and portions 30a and 30c can be built in metal 2 along with the remainder of the data lines 18. Either way, this use of metal 1 jumpers allows the disclosed architecture to be achieved without inadvertently shorting any of the data lines 18 together.

From the foregoing detailed description of a specific embodiment of the invention, it should be apparent that a way of minimizing data line coupling in a semiconductor memory has been disclosed. Specifically, the disclosed twist architecture provides minimized coupling when compared to the prior art, and in particular works to minimize the parasitic capacitance between a given data line and its complement. Although specific embodiments of the invention have been disclosed herein in some detail, this has been done solely for the purposes of illustrating various aspects and features of the invention, and is not intended to be limiting with respect to the scope of the invention. It is contemplated that various substitutions, alterations, and/or modifications, including but not limited to those design alternatives which might have been specifically noted in this disclosure, may be made to the disclosed embodiment without departing from the spirit and scope of the invention as defined in the appended claims.

For example, the improvement in the reduction of parasitic capacitive coupling that is achieved with the disclosed architecture can be achieved if the twisting of any four columns creates four portions such that each column occupies a different position in each of the four portions. Thus, other twisting schemes than that disclosed in FIG. 3 should be readily ascertainable to those skilled in the art of semiconductor design who have had the benefit of reviewing the present disclosure. Furthermore, because Static Random access Memories (SRAMs) also have data line pairs, the disclosed architecture should be useful on those devices as well. Also, the disclosed twist architecture may have utility in non-integrated circuit applications, such as on printed circuit boards or with other types of transmission lines.

What is claimed is:

1. A twist architecture for minimizing the effects of parasitic capacitance in a circuit, the circuit comprising:

first, second, third, and fourth data lines;

four portions, each portion including a first, second, third, and fourth position arranged vertically in each portion, wherein the portions are arranged such that the first positions in the four portions are linear in a horizontal direction, the second positions in the four portions are linear in a horizontal direction, the third positions in the four portions are linear in a horizontal direction, and the fourth positions in the four portions are linear in a horizontal direction;

wherein each of the four portions is occupied by a part of the first, second, third, and fourth data lines; and wherein each data line occupies a different position in each of the four portions.

2. The twist architecture of claim 1, wherein the circuit is an integrated circuit.

3. The twist architecture of claim 2, wherein the integrated circuit includes a DRAM memory array.

4. The twist architecture of claim 1, further comprising boundaries between the first, second, third, and fourth portions, and wherein the boundaries include a twist in the first, second, third, and fourth data lines.

5. The twist architecture of claim 1, further comprising an amplifier coupled to the first, second, third, and fourth data lines.

6. The twist architecture of claim 1, wherein the first, second, third, and fourth portions are of substantially equal length.

7. The twist architecture of claim 1, wherein the first, second, third, and fourth data lines have data states, and wherein the data states of the second and third data lines are complementary, and wherein the data states of the first and fourth data lines are complementary.

8. A twist architecture for minimizing the effects of parasitic capacitance in a circuit, the circuit comprising:

first, second, third, and fourth data lines;

four portions, each portion including a first, second, third, and fourth position arranged vertically in each portion;

wherein each of the four portions is occupied by a part of the first, second, third, and fourth data lines;

wherein each data line occupies a different position in each of the four portions; and wherein each portion includes only the four data line parts.

9. The twist architecture of claim 8, wherein the circuit is an integrated circuit.

10. The twist architecture of claim 8, wherein the integrated circuit includes a DRAM memory array.

11. The twist architecture of claim 8, further comprising boundaries between the first, second, third, and fourth portions, and wherein the boundaries include a twist in the first, second, third, and fourth data lines.

12. The twist architecture of claim 8, further comprising an amplifier coupled to the first, second, third, and fourth data lines.

13. The twist architecture of claim 8, wherein the first, second, third, and fourth portions are of substantially equal length.

14. The twist architecture of claim 8, further comprising a power bus which is adjacent to the first data line in the first portion, the second data line in the second portion, the fourth data line in the third portion, and the third data line in the fourth portion.

15. The twist architecture of claim 8, wherein the first, second, third, and fourth data lines have data states, and wherein the data states of the second and third data lines are complementary, and wherein the data states of the first and fourth data lines are complementary.

* * * * *